United States Patent [19]  [11] 3,947,697
Archer et al.  [45] Mar. 30, 1976

[54] SYNCHRONIZING CIRCUIT INCLUDING TWO FLIP-FLOPS AND CIRCUIT MEANS TO PROTECT A SYNCHRONIZED SIGNAL FROM AN UNSTABLE STATE OF THE FLIP-FLOPS

[75] Inventors: Michel J. M. Archer, La Celle St. Cloud; Henri-Claude L. Battut, Bougival; Robert R. C. Bonami, Meudon; Herve J. P. M. Louboutin, Palaiseau, all of France

[73] Assignee: International Standard Electric Corporation, New York, N.Y.

[22] Filed: Sept. 12, 1974

[21] Appl. No.: 505,294

[30] Foreign Application Priority Data
Sept. 28, 1973 France .......................... 73.34751

[52] U.S. Cl. ............ 307/208; 307/247 R; 307/269; 328/63; 178/69.5 R
[51] Int. Cl.². H03K 19/08; H03K 5/13; H03K 1/17
[58] Field of Search ............... 307/269, 208, 247 R; 328/63, 72; 178/69.5 R

[56] References Cited
UNITED STATES PATENTS

| 3,363,183 | 1/1968 | Bowling et al. ...................... 328/63 |
| 3,422,425 | 1/1969 | Vallee ................................. 328/63 |
| 3,471,790 | 10/1969 | Kaps ................................... 328/63 |
| 3,612,906 | 10/1971 | Kennedy ............................ 307/269 |
| 3,730,994 | 5/1973 | Terry et al. ......................... 328/63 |

Primary Examiner—Stanley D. Miller, Jr.
Attorney, Agent, or Firm—John T. O'Halloran; Menotti J. Lombardi, Jr.; Alfred C. Hill

[57] ABSTRACT

The disclosed synchronizing circuit employs flip-flops to synchronize a data signal to a clock pulse. The two flip-flops are controlled by the clock pulse and a delayed data signal to at least one of the flip-flops, the other flip-flop also being controlled by a delayed data signal or the data signal directly. A temporizing circuit receives the clock pulse and the output signal of one flip-flop and delivers a signal having a variable time delay according to the phase conditions between the data signal and the clock pulse. An AND gate or an appropriately connected JK flip-flop receives the output signal of the other flip-flop and the output signal of the temporizing circuit to provide the desired synchronized output pulse. This synchronizing circuit protects against the flip-flops synchronizing in an unstable state due to the critical period of the sampling edge of the clock pulse.

6 Claims, 5 Drawing Figures 3,947,697

SYNCHRONIZING CIRCUIT INCLUDING TWO FLIP-FLOPS AND CIRCUIT MEANS TO PROTECT A SYNCHRONIZED SIGNAL FROM AN UNSTABLE STATE OF THE FLIP-FLOPS

BACKGROUND OF THE INVENTION

The present invention relates to an improvement to electronic synchronizing circuits designed to protect them from instability.

One well known method to synchronize a data signal to a control pulse signal without fixed phase relations between them makes use of flip-flops. A flip-flop is a two stable state electronic circuit having the ability to change from one state to the other on application of a control pulse or "clock pulse." The change in the state of the flip-flop takes place on the leading or the trailing edge, of the so called "sampling edge," of the clock pulse according to the type of flip-flop employed. For each flip-flop type, recommended operating conditions indicate a minimum time preceding and following the middle of the sampling edge which constitutes a critical period in which the received signal on an input must not change in state. Experience shows that, when the signal to be synchronized changes state during this critical period, the clock pulse may present insufficient power to set the flip-flop properly, thus, providing an output which is held in the unstable state. Some tests have measured the duration of this unstable state, which for a flip-flop having a typical switching time of 10 to 20 nanoseconds, may reach several thousand nanoseconds. Now in many fields, especially in that of computers, it is important that the output signal is stable at the time it is examined.

A mathematical study of this phenomenom carried out at the Washington University (Technical Report No. 15, November 1969) has estimated that the probability of the output voltage of a flip-flop being found outside the unstable region after a time $t$ is a function such as $1 - e^{-t/\tau}$ ($\tau$ being a time constant characteristic of the employed flip-flop).

Therefore, a generally selected solution consists of enabling the output information of the flip-flop only after a time T after which the probability of being in an unstable state is acceptable. However, a disadvantage of this solution is the systematic delay of the information generated, whereas the probability that the change in the state of the signal to be synchronized, on one hand, takes place within the critical period and, on the other hand, involves the instability of the output state of the flip-flop, is low.

SUMMARY OF THE INVENTION

An object of the present invention is to provide a synchronizing device with variable delay enabling taking into account the output information of the synchronizing device after a time delay only when the signal to be synchronized is in critical phase relations with the sampling edge, i.e., when the change in the state of the signal to be synchronized takes place within the critical period.

A feature of the present invention is the provision of an electronic synchronizing circuit employing two stable flip-flops to synchronize a data signal by a clock signal, the data signal having no fixed phase relation with the clock signal, ensuring the protection of a synchronized signal from an unstable state of the flip-flops comprising: two flip-flops each receiving the clock signal and the data signal; at least one delay circuit coupled to one of the two flip-flops to couple the data signal to the one of the two flip-flops after a first given time delay greater than a critical period of the flip-flops; a temporizing circuit coupled to the one of the two flip-flops receiving the clock signal and the output signal of the one of the flip-flops to provide a control signal having a variable delay with respect to the clock signal according to the phase relation between the clock signal and the data signal; and a logic circuit coupled to the temporizing circuit and the other of the two flip-flops to provide a stable logical signal representing the output state of the other of the two flip-flops when the control signal is present.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
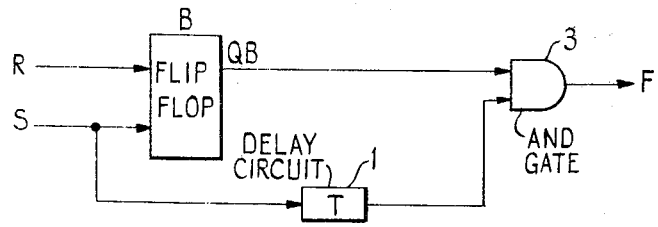
FIG. 1 is a simplified block diagram of a synchronizing device protected by a constant delay known in the prior art.

FIG. 1 shows a prior art synchronizing device with a constant delay comprising a flip-flop B, a delay circuit 1 providing a delay T and an AND gate 3 with one input terminal connected to the output QB of the flip-flop B and the other input terminal connected to the output of delay circuit 1. AND gate 3 recopies on its output F the state of the output QB of flip-flop B a time T after the sampling edge of the clock pulse S is applied, on one hand, to the "clock input" of flip-flop B and, on the other hand, to delay circuit 1. The state of the output QB of flip-flop B is a function of the state of the data signal R during the critical period covering the sampling edge of clock pulse S. The difficulty in estimating the probability that the flip-flop B is in an unstable state after a given time leads to selecting a high value of T with respect to the switching time of the flip-flop. The delay thus introduced in generating of the output data F is at least equal to T, which does not constitute a negligible loss of time when taking into account the low probability that the clock pulse S and the data signal R are in the critical phase conditions.

Figure 2:
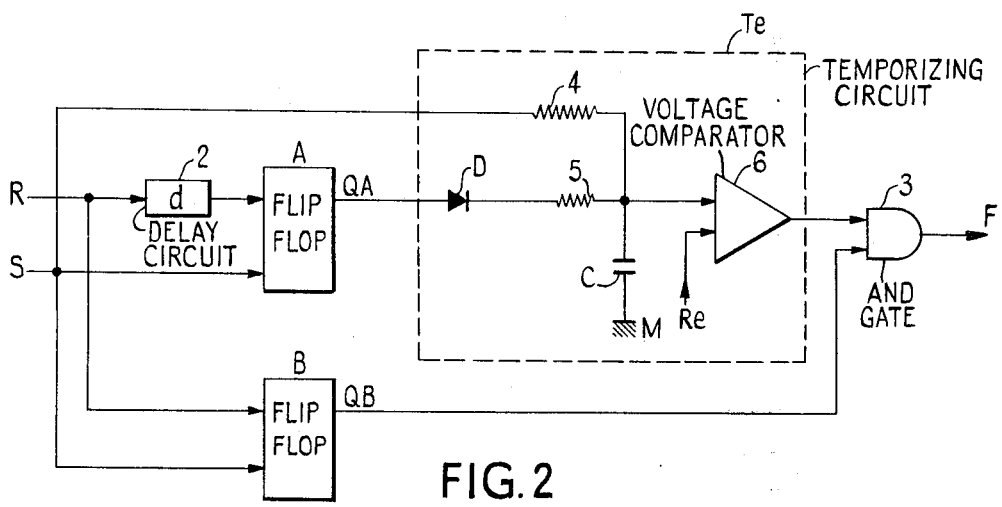
FIG. 2 is a block and schematic diagram of a synchronizing device with a variable delay in accordance with the principles of the present invention with the synchronization being made on the leading edge of the data signal.

FIG. 2 is a block and schematic diagram of one embodiment of a synchronizing device with a variable delay in accordance with the principles of the present invention. FIG. 2 illustrates a synchronizing device carrying out a synchronization of the leading edge of a data signal R with the sampling edge of a clock pulse S. The synchronization is made on the leading or trailing edge according to whether the flip-flops are D or J-K type.

The device shown in FIG. 2 comprises a flip-flop A, triggered by the clock pulse S and receiving the data signal R delayed by a time $d$ by the delay circuit 2; a flip-flop B, triggered by the clock pulse S and directly receiving the data signal R; a temporizing circuit T$e$, one input being connected to the clock inputs of flip-flops A and B and the other input being connected to the output QA of flip-flop A; and an AND gate 3 receiving on its inputs, on one hand, the output signal of temporizing circuit T$e$ and, on the other hand, the state of the output QB of flip-flop B and recopying on its output F the state of the output QB of flip-flop B, when the output of temporizing circuit T$e$ is in the logical state 1.

The temporizing circuit T$e$ comprises one capacitor C, one terminal of which is connected to the ground M; a first charge circuit for capacitor C constituted by a resistor 4 receiving the clock pulse S; a second charge circuit for capacitor C constituted by a resistor 5 connected to the output QA of flip-flop A through a diode D; and a voltage comparator 6 which is supplied with the voltage across the capacitor C, on one hand, a reference voltage Re, on the other hand, and providing a logical state 1 output to AND gate 3 when the voltage across capacitor C is at least equal to reference voltage Re.

The data signal R is applied to flip-flop A after a delay d, which is longer than the duration of the critical period of flip-flops A and B, so that, if the output of one flip-flop (QA or QB) is in an unstable state, then the output of the other flip-flop is in a stable state. This stable state will be one of the logical states 0 or 1. Thus, the outputs QA and QB of flip-flops A and B cannot be in an unstable state simultaneously. In addition, if the output QB of flip-flop B presents an unstable state, the output QA of flip-flop A is then in the state 0, because of the delay of the input signal of flip-flop A introduced by the circuit 2. But, if the output QA of flip-flop A presents an unstable state, the output QB of flip-flop B is then in the state 1. Other output states of flip-flops A and B may be also found, namely either both the outputs QA and QB are stable in the state 0 or in the state 1, or the output QA is in the state 0 and the output QB is in the state 1. The operating of the circuit of FIG. 2 will be studied for various output states of flip-flops A and B and more particularly when one of these presents an unstable state.

1ST CASE: QA IN THE STATE 0 AND QB IN AN UNSTABLE STATE

This case may be found when the sampling edge of the clock pulse S and the leading edge of the data signal R are in critical phase conditions. The clock pulse S charges capacitor C through resistor 4. When the voltage across capacitor C reaches the reference voltage Re, this causes the output voltage comparator 6 to change from 0 to 1, thus enabling AND gate 3 which passes the state of the output QB to the output F of AND gate 3. The resistance of resistor 4 is selected so that the output QB of flip-flop B is stable when the output of comparator 6 is in the state 1, i.e., after a time T.

2ND CASE : QA AND QB IN THE STATE 1

The state 1 of the output QA of flip-flop A causes capacitor C to be charged through resistor 5 and diode D. Capacitor C is also charged by the clock pulse S through resistor 4 and the voltage across the terminals of capacitor C reaches the reference voltage Re rapidly causing the output state of comparator 6 to change state. The state of the output QB is then transferred to the output F of AND gate 3 a time $t$ after the sampling edge of the pulse S. This time $t$ is smaller as the resistance of resistor 5, the apparent resistance of diode D and the propagation times of flip-flop A, comparator 6 and AND gate 3 are made smaller.

3RD CASE: QA IN UNSTABLE STATE AND QB IN THE STATE 1

This case may be found when the sampling edge of the pulse S and the leading edge of the signal supplied by delay circuit 2 from the data signal R, are in critical phase conditions. It has been seen (1st case), when the output QA is in the state 0 capacitor C is charged, through resistor 4, by clock pulse S, but each positive pulse produced on the output QA also charges capacitor C through diode D and resistor 5. The state 1 of the output QB is transferred to the output F of AND gate 3 when the output of comparator 6 changes state, i.e., a time $t1$ after the sampling edge of clock pulse S, which is between the time T (1st case) and the time $t$ (2nd case).

When the outputs QA and QB are stable in states 0 and 1, respectively, capacitor C charged through resistor 4 by clock pulse S commands through comparator 6 and AND gate 3 the output F to change in state only after the time T as in the first case.

Figure 3A:
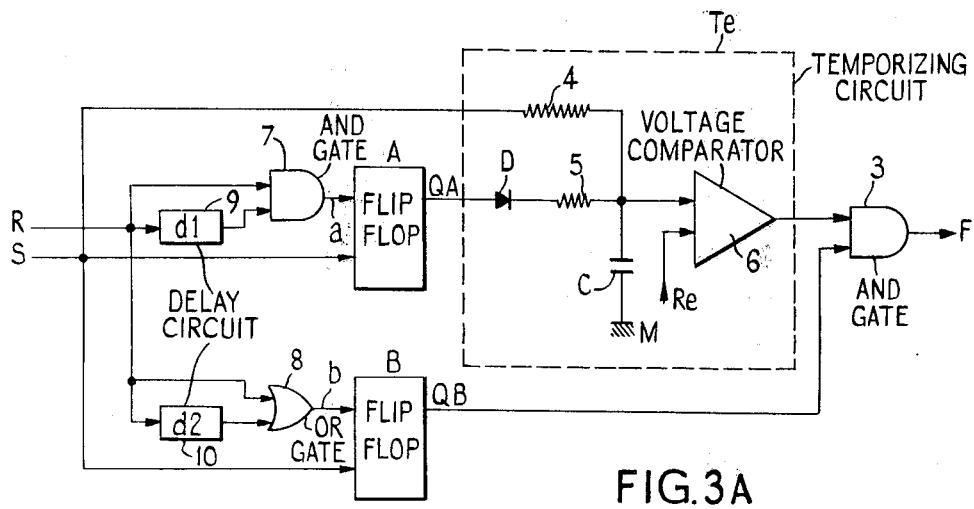
FIG. 3A is a block and schematic diagram of a synchronizing device with a variable delay in accordance with the principles of the present invention with synchronization being made on the leading and the trailing edges of the data signal.

However, since the choice of the synchronization to the leading or the trailing edge of the data signal is not predetermined in the most cases for the synchronizing two signals, it is desirable to have a circuit which provides protection from the unstable state of the outputs of flip-flops on both of the edges of the data signal. Such a synchronizing device, synchronizing on the leading and trailing edges of the data signal, is shown in FIG. 3A. This device again includes the two flip-flops A and B, temporizing circuit Te and AND gate 3. FIG. 3 also includes input circuits for the data inputs of flip-flops A and B, include a delay circuit 9 and an AND gate 7 for flip-flop A and a delay circuit 10 and an OR gate 8 for flip-flop B. The data signal R is applied, on one hand, directly to an input of AND gate 7 and OR gate 8 and, on the other hand, to the other input of circuits 7 and 8 through delay circuit 9 and delay circuit 10, respectively. Signals a and b on the data inputs of flip-flops A and B, the data signal R and signals R($d1$) and R($d2$) supplied by delay circuits 9 and 10 from the data signal are shown in FIG. 3B, in which tp is the propagation time of gates 7 and 8.

Figure 3B:
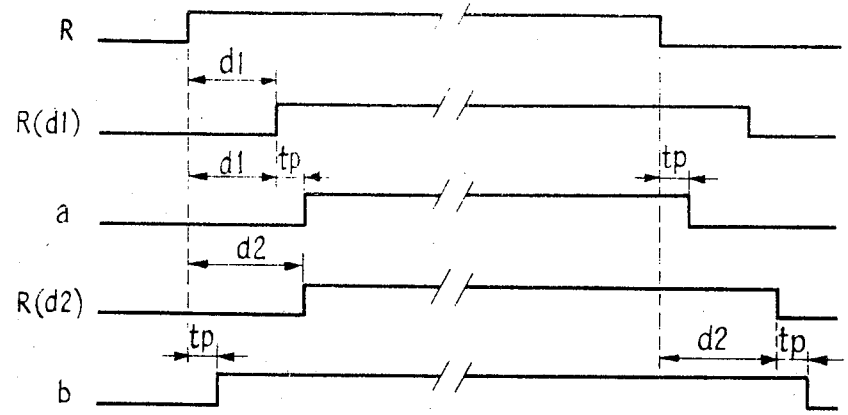
FIG. 3B shows a timing diagram of "data" inputs of the flip-flops of FIG. 3A.

It will be noticed in the diagram of FIG. 3B that the leading edge of the signal $a$ is delayed with respect to the leading edge of the signal R by a time equal to $d1 + tp$ while the leading edge of the signal $b$ is synchronized (except for the propagation time $tp$) with the leading edge of the signal R. On the other hand, the trailing edge of the signal $a$ is synchronized (except for the propagation time tp) with the trailing edge of the signal R while the trailing edge of the signal b is delayed with respect to the trailing edge of the signal R by a time equal to $d2 + tp$.

The input circuits of flip-flops A and B so constituted allow the case of a synchronization on the trailing edge of the data signal being in the same working conditions as that of the previously studied case of a synchronization on the leading edge of the data signal, i.e., when the output QA is in unstable state, the output QB is then in the state 1, and when the output QB is in unstable state, the output QA is then in the state 0. Moreover, when flip-flops A and B are identical and propagation times of gates 7 and 8 equal, two equal values of delay ($d1 = d2$) can be used for delay circuits 9 and 10.

Figure 4:
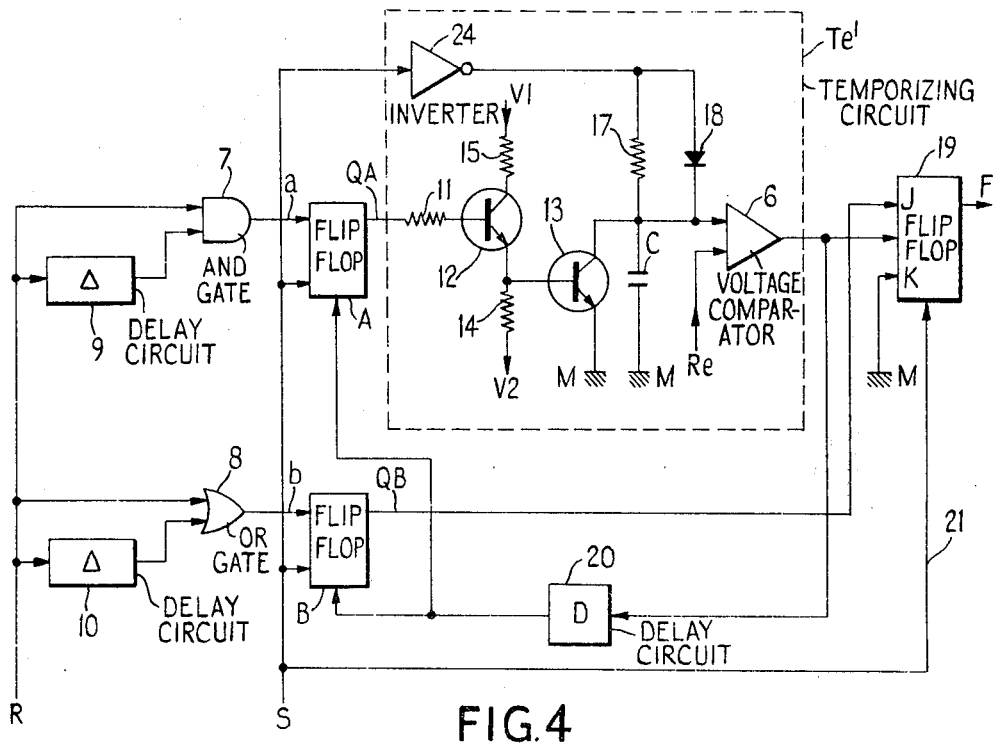
FIG. 4 is a detailed block and schematic diagram of the synchronizing device according to the principles of the present invention.

This configuration of input circuits for flip-flops A and B, enabling two equal delays to be used, is found again in the diagram of FIG. 4 which illustrates an embodiment of the synchronizing device according to the present invention, carrying out a synchronization of the leading and trailing edges of the data signal R with the sampling edge of a clock pulse S. The diagram of FIG. 4 is derived from the diagram of FIG. 3A and differs therefrom by employing a new arrangement of the temporizing circuit T$e'$, the flip-flop 19 which replaces AND gate 3 in FIG. 3A and adding circuits to reset flip-flops A, B and 19 comprising, on one hand, a delay circuit 20 connected to the output of the temporizing circuit T$e'$ and the "clear" imputs of flip-flops A and B and, on the other hand, a conductor 21 connecting the clear input of flip-flop 19 and the clock inputs of slip-flops A and B, thus enabling flip-flop 19 to be reset by the clock pulse S.

The temporizing circuit T$e'$ comprises: one capacitor C and one voltage comparator 6 as previously described; a first circuit connected to the clock inputs of flip-flops A and B and the common terminal to capacitor C and comparator 6 constituted by an inverter circuit 24 and a serially connected resistor 17 to which a diode 18 is connected in parallel; a second circuit connected between the output QA of flip-flop A and the common terminal of capacitor C and comparator 6 including (1) a first NPN type transistor 12 the base of which is connected to the output QA through a resistor 11 and biased by positive voltage V1 and negative voltage V2 respectively applied to the collector through a resistor 15 and to the emitter through a resistor 14 and (2) a second NPN type transistor 13, the base of which is connected to the emitter of first transistor 12, the emitter of which is connected to the ground M and the collector of which is connected to the common terminal of capacitor C and comparator 6.

At rest, i.e., when the clock pulse S does not exist, the charge of capacitor C is held at a higher voltage than the reference voltage Re of comparator 6, because the output of inverter 24 then presents a logical state 1. Times T, $t$ and $t1$ previously defined and elapsed between the sampling edge of clock pulse S and the change in state of comparator 6 output are given by the discharge of the capacitor C either through resistor 17 or through transistor 13 saturated by turning to state 1 of the output QA of flip-flop A, or by both the discharge circuits simultaneously. When voltage across capacitor C reaches reference voltage Re, the output of comparator 6 turns to the state 1 thus enabling the state of the output QB, which is present at the data input J of flip-flop 19 to be transferred to the output F of flip-flop 19. The output signal of comparator 6 is applied, after a delay D given by circuit 20, to the clear inputs of flip-flops A and B, thus setting the outputs QA and QB to the state 0. Likewise the state 0 of clock signal S transmitted by conductor 21 to the clear input of flip-flop 19 keeps this flip-flop in the state 0 until the leading edge of the next clock pulse. The state 0 of signal S also permits the charging again of capacitor C through diode 18, the output of inverter 24 being then in the state 1.

Thus, the signal which is obtained on the output F of flip-flop 19 when the data signal exists, is one whose the trailing edge is synchronized on the trailing edge of the clock pulse S and the leading edge is delayed with respect to the leading edge of the clock pulse with times T, $t$ or $t1$ according to the phase relation existing between the data signal R and the clock pulse S.

While we have described above the principles of our invention in connection with specific apparatus it is to be clearly understood that this description is made only by way of example and not as a limitation to the scope of our invention as set forth in the objects thereof and in the accompanying claims.

We claim:

1. An electronic synchronizing circuit employing two stable flip-flops to synchronize a data signal by a clock signal, said data signal having no fixed phase relation with said clock signal, ensuring the protection of a synchronized signal from an unstable state of said flip-flops comprising:

a first source of said data signal;

a second source of said clock signal;

two flip-flops each having at least an output, a clock input coupled to said second source and a data input;

at least one delay circuit having an input coupled to said first source and an output coupled to said data input of one of said two flip-flops to couple said data signal to said one of said two flip-flops after a first given time delay greater than a critical period of said two flip-flops;

said data input of the other of said two flip-flops being coupled to said first source;

a temporizing circuit having two inputs and an output, one of said two inputs of said temporizing circuit being coupled to said second source to receive said clock signal and the other of said two inputs of said temporizing circuit being coupled to said output of said one of said two flip-flops to receive the output signal of said one of said flip-flops to provide a control signal having a variable delay with respect to said clock signal according to the phase relation between said clock signal and said data signal; and a logic circuit having at least two inputs and an output, one of said two inputs of said logic circuit being coupled to said output of said temporizing circuit and the other of said two inputs of said logic circuit being coupled to said output of the other of said two flip-flops to provide a stable logical signal at said output of said logic circuit representing the output state of said other of said two flip-flops when said control signal is present.

2. A circuit according to claim 1, wherein said logic circuit being an AND gate.

3. A circuit according to claim 1, wherein said logic circuit being a JK-type flip-flop.

4. A circuit according to claim 1, wherein said temporizing circuit includes
   a third source of reference voltage;
   a capacitor having one terminal connected to ground;
   a voltage comparator coupled to said third source and the other terminal of said capacitor to compare the voltage across said capacitor with said reference voltage, the output of said comparator being connected to said one of said two inputs of said logic circuit, and changing logical state when the voltage across said capacitor equals said reference voltage;

first means connected between said other terminal of said capacitor and said one of said two inputs of said temporizing circuit responsive to said clock signal to enable said voltage across said capacitor to change, after a second given time delay greater than said first given time delay, from a rest voltage to said reference voltage, and second means connected between said other terminal of said capacitor and said other of said two inputs of said temporizing circuit enabling said output signal of said one of said two flip-flops to change said voltage across said capacitor from said rest voltage to said reference voltage after a third given time delay less than said second given time delay when said output signal exists and is stable and after a fourth given time delay disposed between said second and third given time delays when said output signal is in an unstable state.

5. A circuit according to claim 4, wherein
said first means provides a slow charging circuit for said capacitor and includes
at least one resistor to receive said clock signal coupled between said one of said two inputs of said temporizing circuit and said other terminal of said capacitor; and
said second means provides a fast charging circuit for said capacitor and includes
a diode coupled to said other of said two inputs of said temporizing circuit, and
a resistor in series with said diode and said other terminal of said capacitor.

6. A circuit according to claim 4, wherein
said first means provides a slow discharge circuit for said capacitor and includes
an inverter to receive said clock signal having an output and an input, said input of said inverter being coupled to said one of said two inputs of said temporizing circuit,
at least one resistor in series between said output of said inverter and said other terminal of said capacitor, and
a diode connected in parallel with said one resistor, said diode charging said capacitor in the absence of said clock signal; and
said second means providing a fast discharge circuit for said capacitor and including
a transistor control circuit having an input and an output, said input of said transistor control circuit being connected to said other of said two inputs of said temporizing circuit, and
a switching transistor connected between said output of said transistor control circuit and said other terminal of said capacitor, said switching transistor being saturated by said transistor control circuit to permit a fast discharge of said capacitor.

* * * * *